(12) United States Patent
Brown et al.

(10) Patent No.: US 8,793,530 B2
(45) Date of Patent: *Jul. 29, 2014

(54) CONTROLLING A SOLID STATE DISK (SSD) DEVICE

(71) Applicant: International Business Machines Corporation, Armonk, NY (US)

(72) Inventors: Joanna K. Brown, Hursley (GB); Ronald J. Venturi, Winchester (GB)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/785,680

(22) Filed: Mar. 5, 2013

(65) Prior Publication Data

US 2013/0185587 A1    Jul. 18, 2013

Related U.S. Application Data

(63) Continuation of application No. 13/260,768, filed as application No. PCT/EP2010/054600 on Apr. 7, 2010.

(30) Foreign Application Priority Data

Apr. 21, 2009  (EP) .................................... 09158373

(51) Int. Cl.
  *G06F 11/00*  (2006.01)
(52) U.S. Cl.
  USPC ........................................... 714/6.1; 711/162
(58) Field of Classification Search
  USPC ....................................................... 714/6.1
  See application file for complete search history.

(56) References Cited

U.S. PATENT DOCUMENTS

| 5,745,673 | A | | 4/1998 | Di Zenzo et al. |
| 5,841,699 | A | * | 11/1998 | Miyauchi ................. 365/185.33 |
| 5,875,477 | A | * | 2/1999 | Hasbun et al. ................. 711/162 |
| 6,295,619 | B1 | * | 9/2001 | Hasbun et al. ................. 714/719 |
| 6,484,290 | B1 | | 11/2002 | Chien et al. |
| 7,343,360 | B1 | | 3/2008 | Ristanovic et al. |
| 7,984,325 | B2 | * | 7/2011 | Fukutomi et al. ............ 714/6.12 |
| 8,103,825 | B2 | | 1/2012 | McKean |
| 8,108,737 | B2 | | 1/2012 | Stenfort |

(Continued)

FOREIGN PATENT DOCUMENTS

| CN | 101388255 A | 3/2009 |
| JP | 05143471 A | 6/1993 |

(Continued)

OTHER PUBLICATIONS

EP Examination Report, Application Serial No. 10713443.9 dated Jun. 15, 2012, 3 pages.

(Continued)

*Primary Examiner* — Kamini Patel
(74) *Attorney, Agent, or Firm* — Francis Lammes; Stephen J. Walder, Jr.; Randall J. Bluestone

(57) ABSTRACT

A mechanism is provided for controlling a solid state disk. A failure detector detects a failure in the solid state disk. Responsive to failure detector detecting a failure, a status degrader sets a degraded status indicator for the solid state disk. Responsive to the degraded status indicator, a degraded status controller maintains the solid state disk in operation in a degraded operation mode.

5 Claims, 2 Drawing Sheets

(56) References Cited

U.S. PATENT DOCUMENTS

| | | | |
|---|---|---|---|
| 8,112,489 B1 | 2/2012 | Cox et al. | |
| 8,285,955 B2 * | 10/2012 | Frame et al. | 711/162 |
| 8,307,159 B2 | 11/2012 | McKean | |
| 8,489,820 B1 * | 7/2013 | Ellard | 711/138 |
| 2008/0263305 A1 | 10/2008 | Shu et al. | |
| 2008/0313496 A1 | 12/2008 | Prabhakaran et al. | |
| 2009/0063895 A1 * | 3/2009 | Smith | 714/7 |
| 2009/0083476 A1 | 3/2009 | Pua et al. | |
| 2009/0172499 A1 * | 7/2009 | Olbrich et al. | 714/773 |
| 2010/0079885 A1 * | 4/2010 | McKean | 360/15 |
| 2010/0125695 A1 | 5/2010 | Wu | |
| 2010/0332862 A1 | 12/2010 | Lester et al. | |
| 2011/0093674 A1 * | 4/2011 | Frame et al. | 711/162 |
| 2011/0252186 A1 * | 10/2011 | Dinker | 711/103 |
| 2012/0042211 A1 | 2/2012 | Brown et al. | |
| 2012/0110252 A1 | 5/2012 | McKean | |

FOREIGN PATENT DOCUMENTS

| | | | |
|---|---|---|---|
| JP | 07200373 | A | 8/1995 |
| JP | 09034805 | A | 2/1997 |
| JP | 09330598 | A | 12/1997 |
| JP | 2000172570 | A | 6/2000 |
| JP | 2003223284 | A | 8/2003 |
| JP | 2004021811 | A | 1/2004 |
| JP | 2004094429 | A | 3/2004 |
| JP | 2008171163 | A | 7/2008 |
| WO | WO2005/084218 | A2 | 9/2005 |
| WO | WO2010/121902 | A1 | 10/2010 |

OTHER PUBLICATIONS

Response to Examiner's Report filed Oct. 9, 2012, EP Application Serial No. 10713443.9, 5 pages.

U.S. Appl. No. 13/260,768.

* cited by examiner

CONTROLLING A SOLID STATE DISK (SSD) DEVICE

BACKGROUND

The present invention relates to the field of controlling solid state disks (SSD) and more specifically to an automated apparatus and method for handling failures in systems comprising SSDs.

With recent advances in storage technology, it is becoming possible to store data using Solid State Drive (SSD) technology, in which devices comprising solid-state memory are used to replace conventional spinning disk storage devices. However, SSD technology has specific device failure-related problems which are not found in conventional spinning disk technologies, and these problems constitute a factor which may inhibit their use, particularly in mission-critical environments.

The applicant thus believes that it is desirable to have an automated apparatus and method for handling failures in systems comprising SSDs in such a way as to address and alleviate the above problems.

SUMMARY

The present invention accordingly provides, in a first aspect, an apparatus for controlling a solid state disk comprises: a failure detector operable to detect a failure in the solid state disk; a status degrader, responsive to failure detector detecting a failure, operable to set a degraded status indicator for the solid state disk; and a degraded status controller, responsive to the degraded status indicator, to maintain the solid state disk in operation in a degraded operation mode.

In a second aspect, there is provided a method for controlling a solid state disk comprising: detecting by a failure detector a failure in the solid state disk; responsive the step of detecting a failure, setting by a status degrader a degraded status indicator for the solid state disk; and responsive to the degraded status indicator, maintaining by a degraded status controller the solid state disk in operation in a degraded operation mode.

In a third aspect, there is provided a computer program product comprising a computer readable storage medium having a computer readable program stored thereon, where the computer readable program, when loaded into a computer system and executed thereon, cause the computer system to perform various ones of and combinations of, the operations outlined above with regard to the method illustrative embodiment.

Preferred embodiments of the present invention thus advantageously provide an automated apparatus and method for handling failures in systems comprising SSDs.

BRIEF DESCRIPTION OF THE SEVERAL VIEWS OF THE DRAWINGS

A preferred embodiment of the present invention will now be described, by way of example only, with reference to the accompanying drawings, in which.

DETAILED DESCRIPTION

Figure 1:
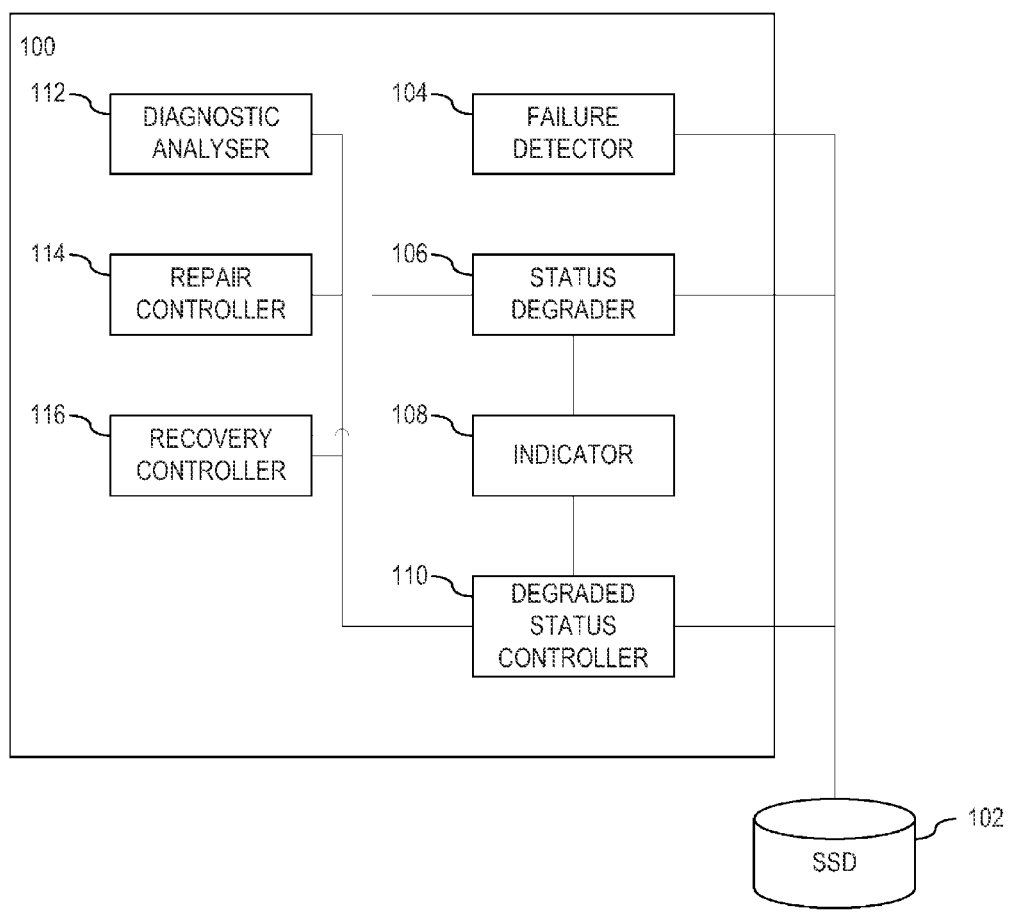
FIG. 1 shows a schematic representation of an exemplary apparatus according to a preferred embodiment of the present invention.

Solid State Drive (SSD) technology has specific failure modes which are not found in conventional disk drive (i.e. spinning disk) technologies—some failures can cause the SSD to unexpectedly take itself offline from the storage subsystem for extended periods while attempting recovery, cause it to permanently lose access to some user data held in volatile memory, or leave it exposed to catastrophic failure in the event of a power loss. These failures can be tolerated in the non-critical environments for which SSD devices were originally intended, but they cannot be tolerated in the mission-critical situations where SSDs are being deployed today. While it may not be possible to prevent the root cause of these failures from occurring (i.e. component failure, unexpected power loss, etc), it would be desirable to manage the failure in a controlled manner, to minimise system damage due to the SSD failure, and to allow general error recovery at a system level. The use of SSD devices in mission-critical situations is relatively new, and little protection against these failures is available in the known art.

Severe failure modes are primarily those which make the device unusable without prior warning—two specific exemplary cases are listed here—both are related to the common design of SSD devices in which a large volatile memory is used to hold both the write data sent to the device prior to it being saved in permanent Flash memory, and the dynamic tables which point to the locations in permanent memory where the write data is subsequently saved—normally the SSD provides backup power in the form of batteries or super-capacitors to protect the contents of the volatile memory in the event of a loss of main power.

Exemplary known failure modes are:
1. the SSD encounters a logic or firmware error which causes it to suspect corruption of the data tables held in the volatile memory—it can no longer use the tables to find saved data, or to save new write data, so it has to reconstruct the dynamic tables by reading every location in the permanent storage—this takes a long time (30 minutes typically) which will cause the system to regard the drive as "failed".
2. the SSD backup power supply fails leaving the volatile storage exposed in the event of a real power loss—if a real power loss does occur, the SSD has no opportunity to save all of its cached write data to permanent storage, and so this indeterminate amount of data is permanently lost.

Embodiments of the present invention provide approaches to alleviation of these problems based on the SSD detecting the failure condition, and providing a unique indication of the failure to the storage system—this allows the system to control the recovery process and limit the damage. A significant advantage of this solution is that the system is immediately notified of the type of catastrophic failure which has occurred, and the SSD remains available and responsive to the system during recovery actions, rather than being offline with unknown symptoms.

There are three major conceptual elements to the error-handler according to one embodiment of the present invention:
1. error detection and reporting
2. recovery control
3. external logging Element 1 requires the SSD to be aware that one of the known failure modes has occurred—when either the "Table Rebuild Required" or the "Backup Power Failed" event is detected, the device must add a unique event to its internal Event Log, and then enter a "Format Degraded" status—while in this status, the device remains online and able to handle SCSI commands which do not access the media e.g.

Log Sense, Inquiry, etc—so the system can use a selection of non-media commands to gather information about the cause of failure Element 2 requires that the SSD is able to process the degraded status in response to a vendor-unique SCSI command from the system—thus the system can control the recovery of the device, and gain limited access to the media if required for emergency repair.

In the implementation described here, two parameters are added to Byte 2 of the Command Descriptor Block (CDB) for the SCSI Format command, as shown by the following table:
CDB Format

| Byte | Bit | | | | | | | |
|---|---|---|---|---|---|---|---|---|
| | 7 | 6 | 5 | 4 | 3 | 2 | 1 | 0 |
| 0 | Opcode = 04h | | | | | | | |
| 1 | 0 | 0 | 0 | 0 | 0 | 0 | 0 | 0 |
| 2 | Data_OK | Pwr_OK | 0 | 0 | 0 | 0 | 0 | 0 |
| 3 | Obsolete | | | | | | | |
| 4 | | | | | | | | |
| 5 | 0 | 0 | 0 | 0 | 0 | 0 | 0 | 0 |

In the above table, the Data_OK parameter (Data_OK–'1'b) is used to signal that the format-degraded drive (Table Rebuild pending) should now clear the Format-Degraded condition and commence the Table Rebuild action, using:

CDB=04 00 80 00 00 00.

The Pwr_OK parameter (Pwr_OK–'1'b) is used to signal that the power-degraded drive (Backup Power has failed) should now clear Power-Degraded condition (but not the value shown in Log Page 3Fh) and the Write Protect condition, using:

CDB=04 00 40 00 00 00.

Element 3 requires that the SSD maintains a vendor-unique Log Page to reflect these Degraded Modes—this allows the system to check the current status of the SSD, which may have changed since a Degraded Mode event was first reported.

In the implementation described here, vendor-unique Log Page 3Fh is defined as shown in the following table:

| Byte | Bit | | | | | | | |
|---|---|---|---|---|---|---|---|---|
| | 7 | 6 | 5 | 4 | 3 | 2 | 1 | 0 |
| 0 | Reserved | | | Page Code = 3Fh | | | | |
| 1 | Reserved = 00h | | | | | | | |
| 2-3 | Page Length = [0004h] | | | | | | | |
| 4 | Data Format Status = 40h (normal) = 80h (Degraded) | | | | | | | |
| 5 | Power Backup Status = 40h (normal) = 80h (Degraded) | | | | | | | |
| 6 | Reserved = 00h | | | | | | | |
| 7 | Reserved = 00h | | | | | | | |

In the above table, Data Format Status=80h indicates that a Table Rebuild is required. It can only be reset to 40h when a Table Rebuild or SCSI Format Unit is completed. Power Backup Status=80h indicates that backup power has failed. It can only be reset to 40h following a power cycle and a successful test of the backup power component.

Referring now to FIG. 1, there is shown an exemplary apparatus 100 for controlling a solid state disk 102 comprising a failure detector 104 operable to detect a failure in solid state disk 102. Status degrader 106, responsive to failure detector 104 detecting a failure, is operable to set a degraded status indicator 108 for solid state disk 102, and degraded status controller 110 is responsive to degraded status indicator 108 to maintain solid state disk 102 in operation in a degraded operation mode. Also shown in FIG. 1 is diagnostic analyser 112 for analysing the failure during the degraded operation mode. Repair controller 114 is operable to repair contents of solid state disk 102 during degraded operation mode. Recovery controller 116 is operable to recovering solid state disk 102 from the failure and to reset degraded status indicator 108 on completion of repair and recovery actions.

Figure 2:
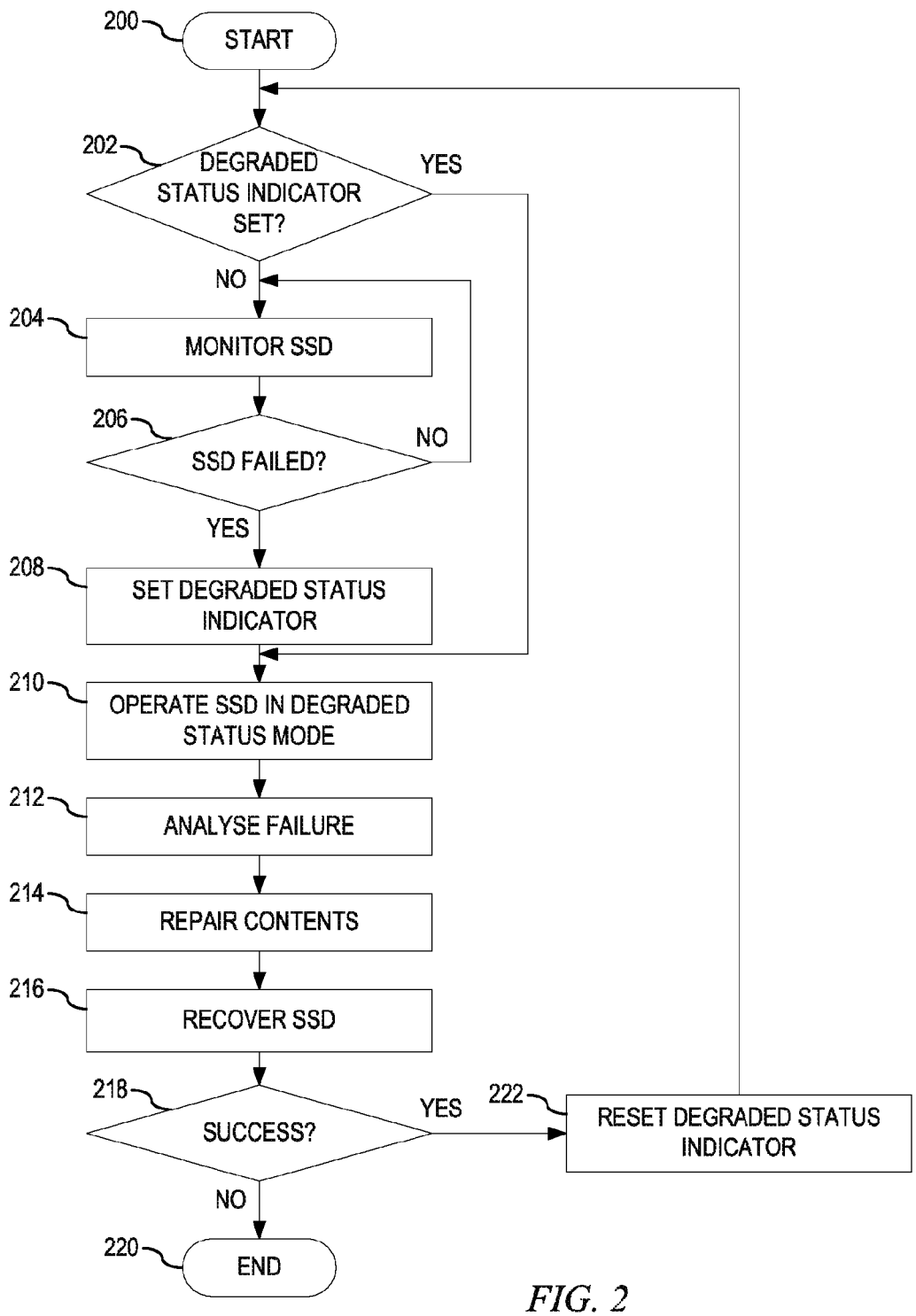
FIG. 2 shows a flow chart representation of an exemplary method according to a preferred embodiment of the present invention.

Turning to FIG. 2, there is shown in flow chart form an exemplary method for controlling a solid state disk according to a preferred embodiment of the present invention.

After START step 200, test step 202 determines whether the degraded status indicator is set, and if the degraded status indicator is set, the process passes immediately to process step 210. If test step 202 determines that the degraded status indicator is not set, the system proceeds to operate monitor the SSD at step 204. Test step 206 determines if the SSD has failed. If not, the system continues to monitor at step 204 and test at step 206. If test step 206 determines that the SSD has failed, the degraded status indicator is set at process step 208, and at step 210, the SSD is operated in degraded status mode. The failure is analysed, at step 212. At step 214, the contents of the SSD are repaired, and at step 216, a recovery action is performed on the SSD. If the recovery action at step 216 returns an unsuccessful outcome at test step 218, the process ends at end step 220. If the recovery action at step 216 returns an unsuccessful outcome at test step 218, the degraded status indicator is reset at step 222 and the process returns to start step 200.

It will be clear to one of ordinary skill in the art that all or part of the method of the preferred embodiments of the present invention may suitably and usefully be embodied in a logic apparatus, or a plurality of logic apparatus, comprising logic elements arranged to perform the steps of the method and that such logic elements may comprise hardware components, firmware components or a combination thereof.

It will be equally clear to one of skill in the art that all or part of a logic arrangement according to the preferred embodiments of the present invention may suitably be embodied in a logic apparatus comprising logic elements to perform the steps of the method, and that such logic elements may comprise components such as logic gates in, for example a programmable logic array or application-specific integrated circuit. Such a logic arrangement may further be embodied in enabling elements for temporarily or permanently establishing logic structures in such an array or circuit using, for example, a virtual hardware descriptor language, which may be stored and transmitted using fixed or transmittable carrier media.

It will be appreciated that the method and arrangement described above may also suitably be carried out fully or partially in software running on one or more processors (not shown in the figures), and that the software may be provided in the form of one or more computer program elements carried on any suitable data-carrier (also not shown in the figures) such as a magnetic or optical disk or the like. Channels for the transmission of data may likewise comprise storage media of all descriptions as well as signal-carrying media, such as wired or wireless signal-carrying media.

A method is generally conceived to be a self-consistent sequence of steps leading to a desired result. These steps require physical manipulations of physical quantities. Usually, though not necessarily, these quantities take the form of electrical or magnetic signals capable of being stored, transferred, combined, compared, and otherwise manipulated. It is convenient at times, principally for reasons of common usage, to refer to these signals as bits, values, parameters, items, elements, objects, symbols, characters, terms, numbers, or the like. It should be noted, however, that all of these terms and similar terms are to be associated with the appropriate physical quantities and are merely convenient labels applied to these quantities.

The present invention may further suitably be embodied as a computer program product for use with a computer system. Such an implementation may comprise a series of computer-readable instructions either fixed on a tangible medium, such as a computer readable medium, for example, diskette, CD-ROM, ROM, or hard disk, or transmittable to a computer system, via a modem or other interface device, over either a tangible medium, including but not limited to optical or analogue communications lines, or intangibly using wireless techniques, including but not limited to microwave, infrared or other transmission techniques. The series of computer readable instructions embodies all or part of the functionality previously described herein.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed, as a removable medium with accompanying printed or electronic documentation, for example, shrink-wrapped software, pre-loaded with a computer system, for example, on a system ROM or fixed disk, or distributed from a server or electronic bulletin board over a network, for example, the Internet or World Wide Web.

In one alternative, the preferred embodiment of the present invention may be realized in the form of a computer implemented method of deploying a service comprising steps of deploying computer program code operable to, when deployed into a computer infrastructure and executed thereon, cause the computer system to perform all the steps of the method.

In a further alternative, the preferred embodiment of the present invention may be realized in the form of a data carrier having functional data thereon, the functional data comprising functional computer data structures to, when loaded into a computer system and operated upon thereby, enable the computer system to perform all the steps of the method.

The invention claimed is:

1. A method, in a computer system, for controlling a solid state disk comprising:
    detecting, by a failure detector, a failure in the solid state disk;
    responsive to the failure detector detecting the failure, setting, by a status degrader, a degraded status indicator for the solid state disk; and
    responsive to the status degrader setting the degraded status indicator, maintaining, by a degraded status controller, the solid state disk in operation in a degraded operation mode wherein, while maintaining the solid state disk in operation in the degraded operation mode, the solid state disk remains online and able to handle SCSI commands which do not access the media within the solid state disk so that non-media commands are executed by the solid state disk to gather information about the cause of the failure.

2. The method of claim 1, further comprising:
analyzing, by a diagnostic analyzer, the failure during the degraded operation mode.

3. The method of claim 1, further comprising:
repairing, by a repair controller, contents of the solid state disk, during the degraded operation mode.

4. The method of claim 1, further comprising:
recovering, by a recovery controller, the solid state disk from the failure.

5. The method of claim 4, further comprising:
resetting, by the recovery controller, the degraded status indicator in response to the solid state disk being recovered.

* * * * *